United States Patent [19]

Matson et al.

[11] Patent Number: 4,727,647

[45] Date of Patent: Mar. 1, 1988

[54] VCD TOOLING FOR DIP COMPONENTS OF DIFFERENT WIDTHS

[75] Inventors: Crawford A. Matson, Wyalusing; Roy G. Space, Brackney, both of Pa.

[73] Assignee: Universal Instruments Corporation, Binghamton, N.Y.

[21] Appl. No.: 897,272

[22] Filed: Aug. 18, 1986

[51] Int. Cl.⁴ .................... H05K 3/30; B23P 19/00
[52] U.S. Cl. .......................... 29/838; 29/741; 414/739
[58] Field of Search ............. 29/740, 741, 845, 837, 29/840, 838; 414/739; 294/106

[56] References Cited

U.S. PATENT DOCUMENTS

| 3,564,691 | 2/1971 | Ackerman | 29/741 X |
| 4,417,683 | 11/1983 | Lewis et al. | 29/741 X |
| 4,470,182 | 9/1984 | Zemek et al. | 29/741 X |
| 4,625,399 | 12/1986 | Zemek et al. | 29/741 X |
| 4,628,594 | 12/1986 | Yamagami et al. | 29/741 |

FOREIGN PATENT DOCUMENTS 57-199296  12/1982  Japan ..................... 29/741

OTHER PUBLICATIONS

IBM Technical Disclosure Bulletin, vol. 28, No. 2, Jul. 1985, pp. 693-694.

Primary Examiner—Howard N. Goldberg
Assistant Examiner—Carl J. Arbes
Attorney, Agent, or Firm—Franklin D. Wolffe; Morris Fidelman

[57] ABSTRACT

The invention is directed to a method and apparatus for gripping DIP components automatically without the need for shutting down the machine to change the tooling assembly when handling components which differ in width. Two sets of fingers are provided, with one set inside the other, such that engagement of the inner pair with a wide component causes automatic retraction of them sufficiently for gripping of the component by the outer pair. In the absence of a component, the inner pair of fingers is automatically extended for subsequent component handling.

12 Claims, 11 Drawing Figures

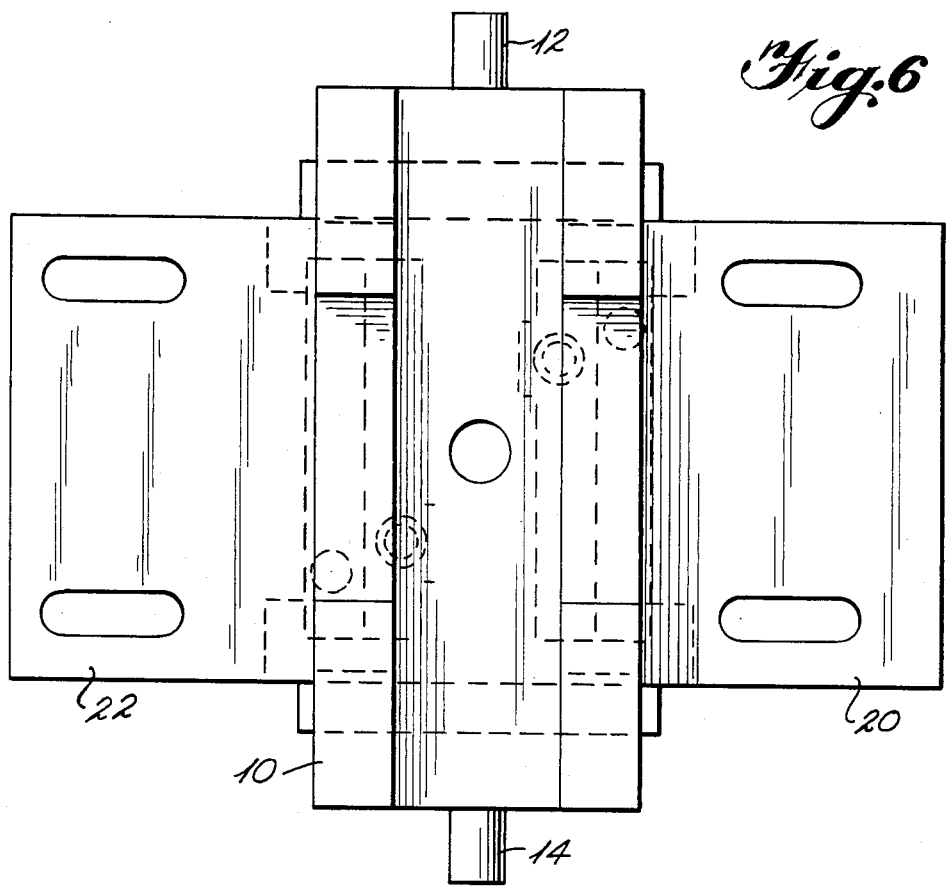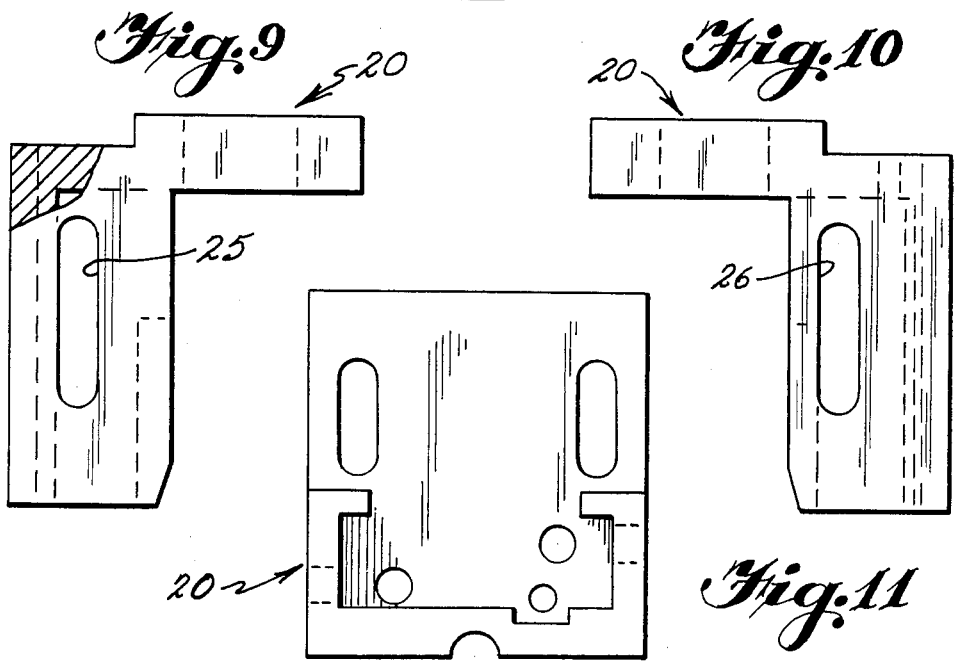

VCD TOOLING FOR DIP COMPONENTS OF DIFFERENT WIDTHS

PRIOR ART CROSS-REFERENCE

U.S. Pat. No. 4,500,032—Ackerman—METHOD AN APPARATUS FOR PROPER REGISTRATION OF MATING PARTS, issued Feb. 19, 1985.

BACKGROUND OF THE INVENTION

The invention is in the field of article handling, particularly the pick-up of DIP components and insertion of the leads thereof into corresponding holes of a circuit board.

Presently, mounting of components which differ in a particular dimension such as body width requires a different tooling assembly for each size of component. Thus, operation of more than one tooling assembly at a time, or machine "down time" for a tooling change, is required in order to switch back and forth between components differing in width.

It is an object of this invention to provide for automatic changing back and forth between gripper fingers of a tooling assembly according to variations in a particular dimension of components, without interrupting the component handling process.

Further, it is an object of this invention to minimize the footprint of a tooling assembly which automatically selects and uses different sets of gripping fingers according to differences in a particular dimension from one component to the next.

Additionally, it is an object of the invention to provide a tooling assembly which grips DIP components with 0.300 inch and 0.600 inch CTC lead spacings by different pairs of gripping fingers, selectively and automatically, according to body widths of the components.

These and other objects will become apparent from the following detailed description of the invention

BRIEF SUMMARY OF THE INVENTION

The invention is directed to a method and apparatus for gripping DIP components automatically without the need for shutting down the machine to change the tooling assembly when handling components which differ in width. Two sets of fingers are provided, with one set inside the other, such that engagement of the inner pair with a wide component causes automatic retraction of them sufficiently for gripping of the component by the outer pair. In the absence of a component, the inner pair of fingers is automatically extended for subsequent component handling.

BRIEF DESCRIPTION OF THE DRAWINGS

FIG. 6 is a top plane view of the device of FIG. 3.

FIGS. 8-11 are, respectively, front elevation, left and right side elevations, and bottom plane view of one-half of the split housing and guide for the tooling assembly.

DETAILED DESCRIPTION OF THE INVENTION

In a preferred embodiment of the invention, the support bracket 10 will be bolted or otherwise attached to a robot hand such as that disclosed in U.S. Pat. No. 4,500,032 as a replacement for the gripper assembly of that hand while retaining the pusher bar thereof, and the disclosure of this patent is incorporated herein by reference.

Figure 3:
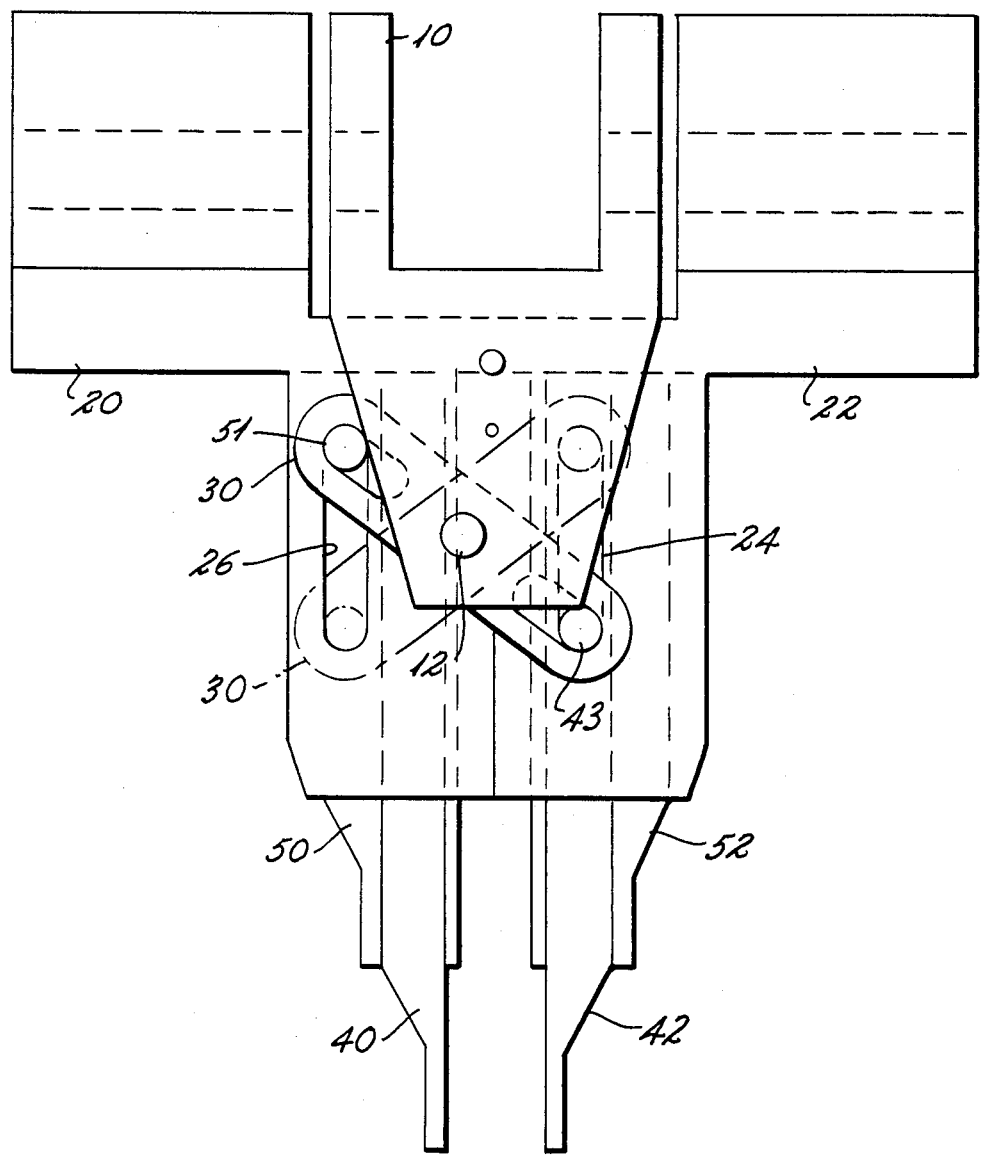
FIG. 3 is a side elevation of the replaceable tooling assembly.
Figure 4:
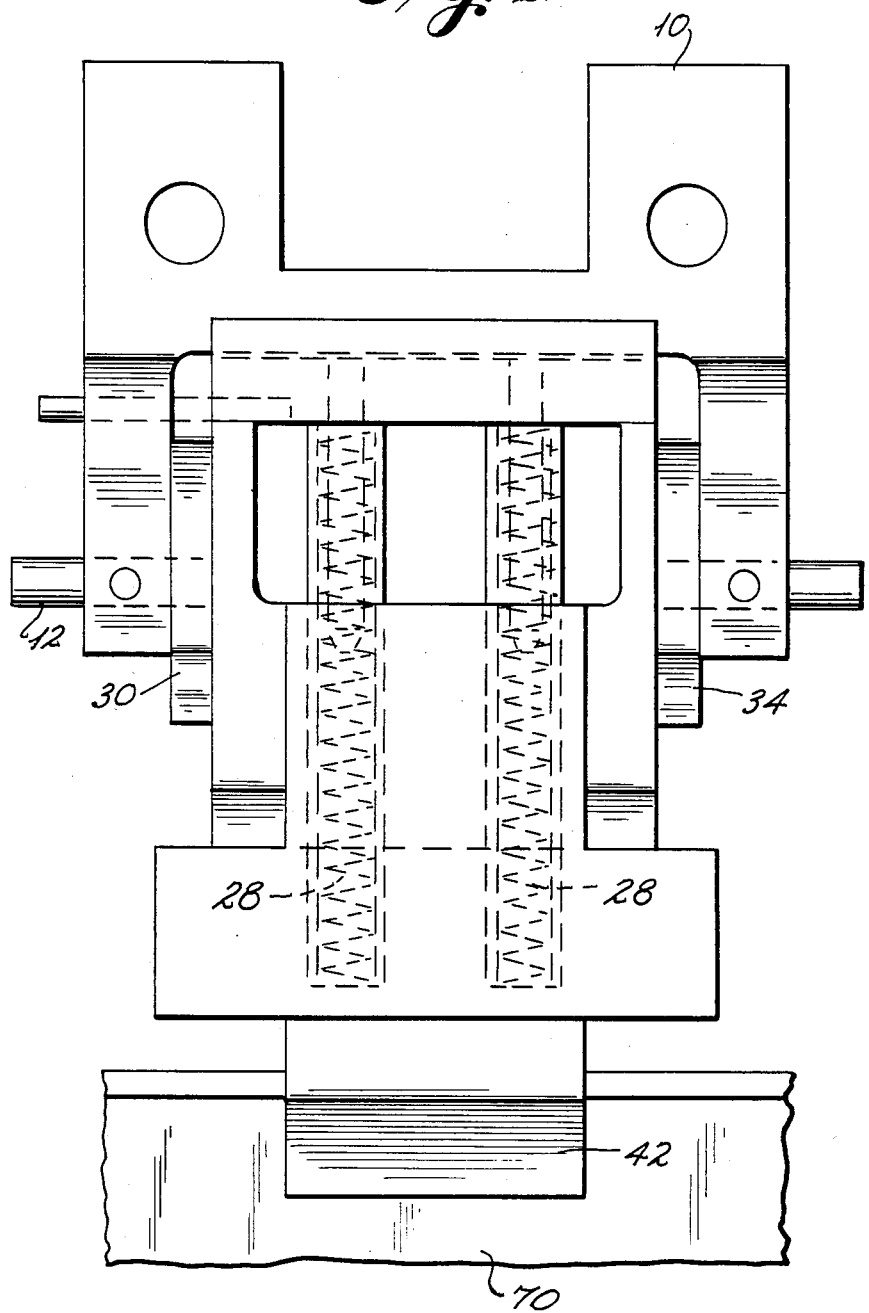
FIG. 4 is a right side elevation of the device of FIG. 3.
Figure 5:
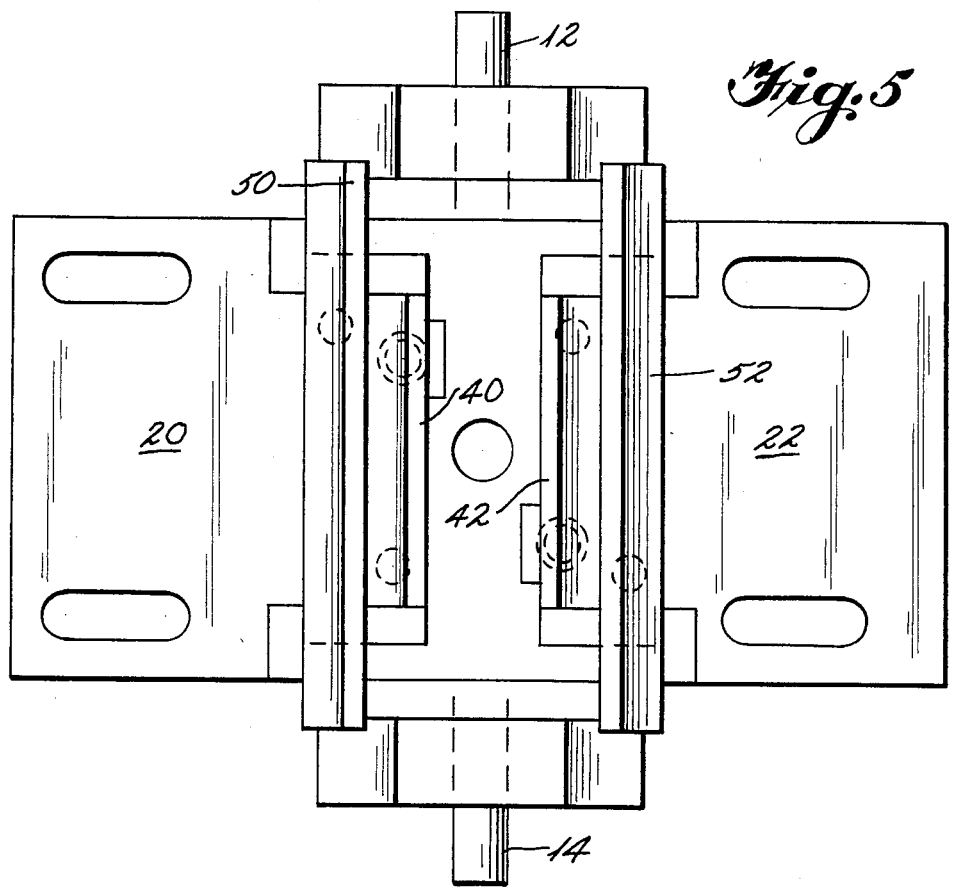
FIG. 5 is a bottom plane view of the device of FIG. 3.
Figure 7:
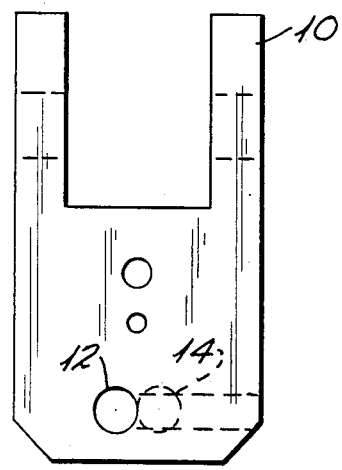
FIG. 7 is a front side elevation of a support bracket for the tooling assembly illustrating the offset pivot and support points for the linkages of the tooling assembly.
Figure 8:
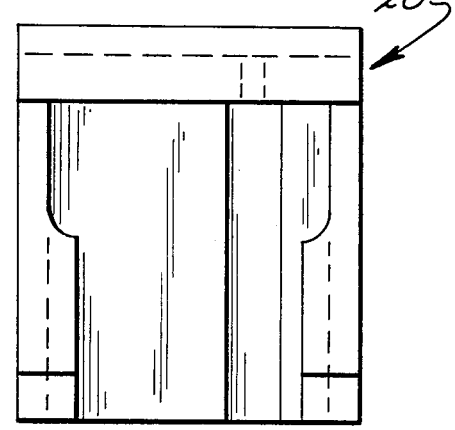

The tooling assembly of the instant invention comprises two separate housing and guide halves 20, 22 which also are supported by the robot hand or the like to which bracket 10 is attached. Referring to FIGS. 8-11, it may be seen that bracket 20 has slots 25 and 26 at opposite ends thereof and offset relative to each other, with slot 25 acting as a guide for an inside finger 40 and slot 26 acting as a guide for outside finger 50. Housing half 22 is similar to housing half 20 and provides guide slots for inside finger 42 and outside finger 52. As seen in FIGS. 3-5, pins 12 and 14 have parallel, offset axes and provide pivotal support, respectively, for links 30 and 34 by support bracket 10. Each link 30 and 34 has a pair of slots near the outer ends thereof for sliding reception of a rod.

Figure 1:
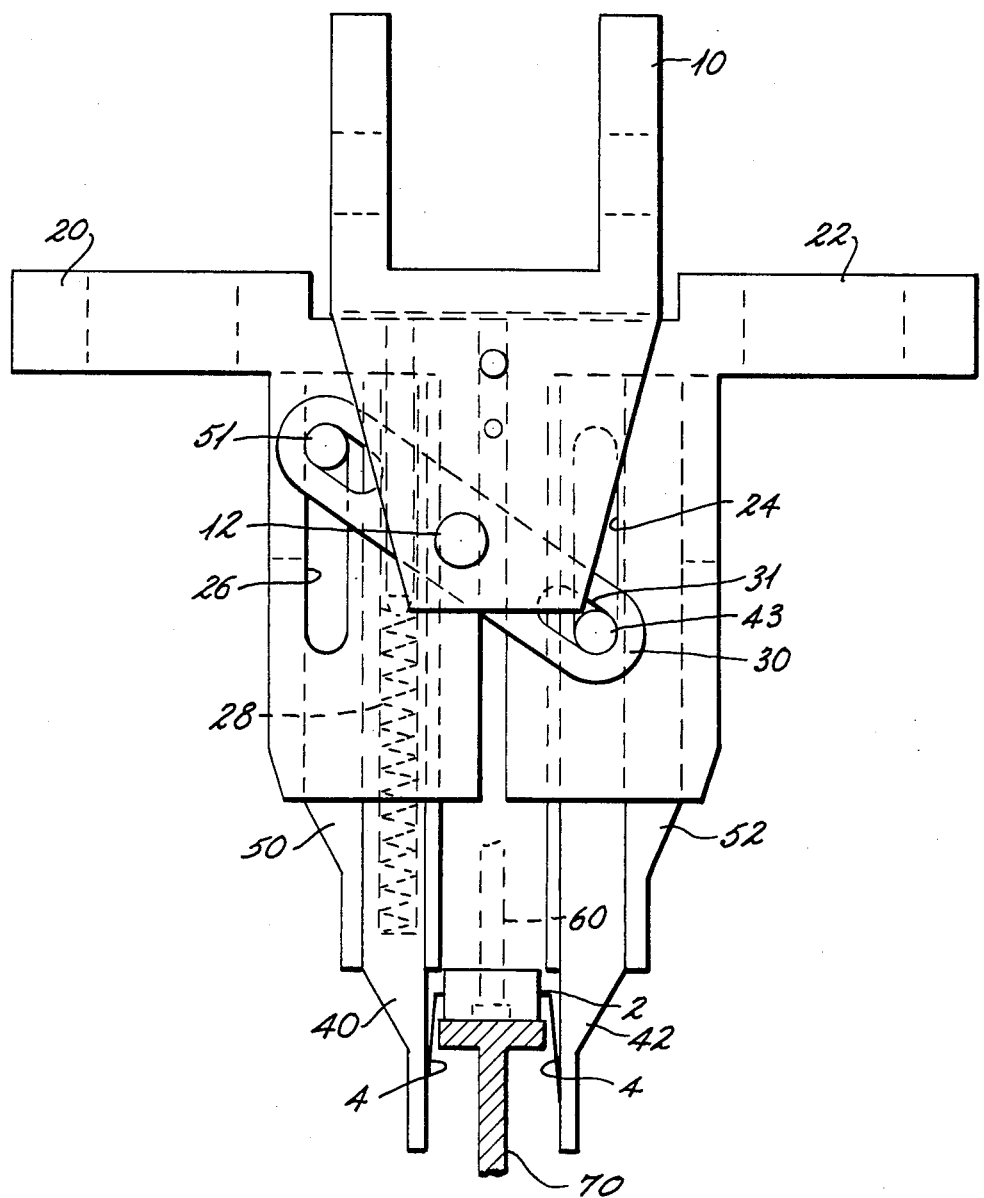
FIGS. 1 and 2 are front elevation illustrating, respectively, the tooling assembly gripping small and large components.
Figure 2:
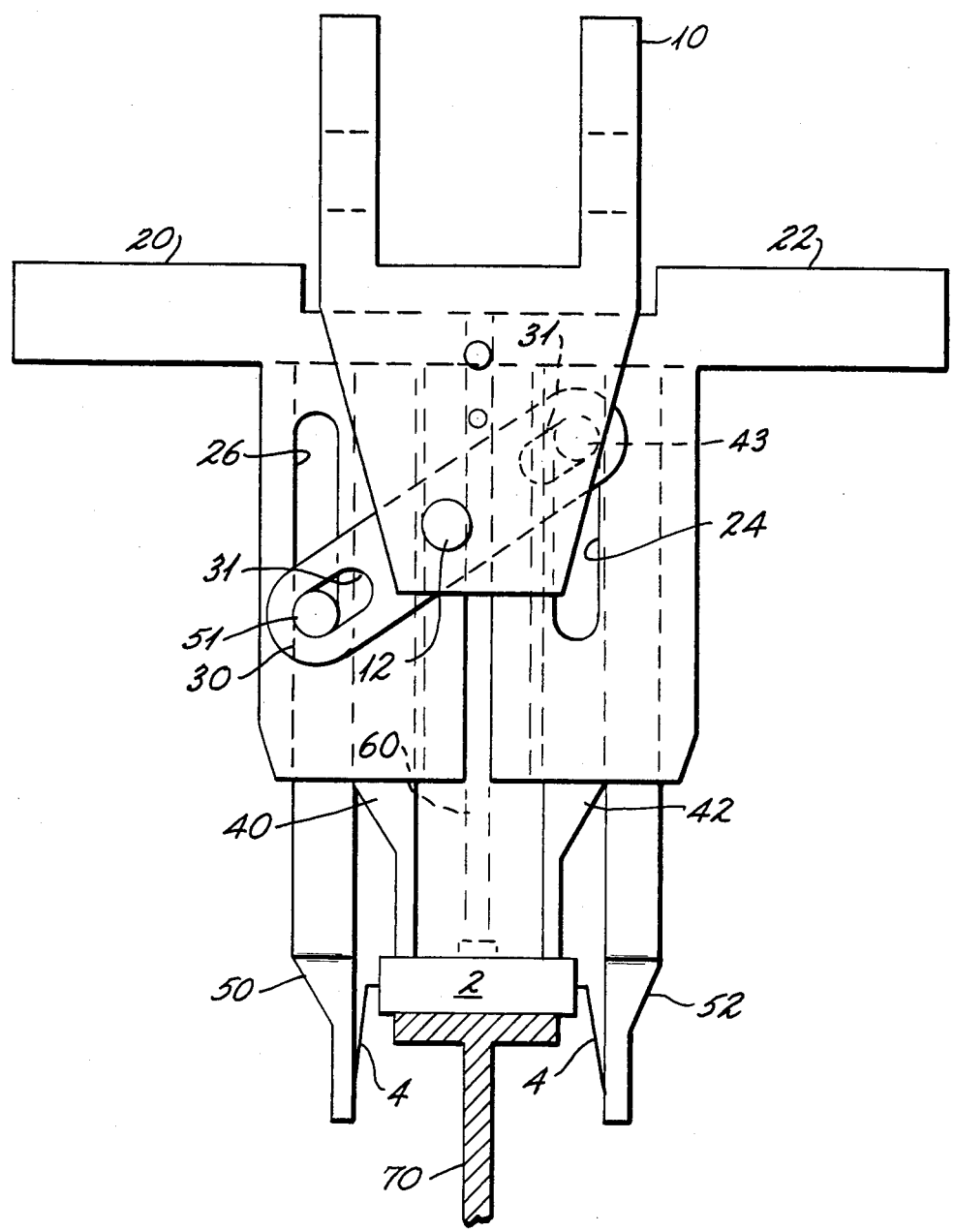

As seen in FIGS. 1 and 2, the slot on the left end of link 30 receives a actuating rod 51 which extends through slot 26 of housing half 20 of slot 31 in the right hand end of link 30 receives actuating rod 43 of inside finger 42, with actuating rod 43 fitting through guide slot 24 of housing half 22. On the opposite end (right hand side of FIG. 4) of the tooling assembly, pin 14 supports link 34 which is slidably connected to inside finger 40 and outside finger 52. Compression springs 28 are provided in inside fingers 40 and 42 in order to urge these inner fingers to the extended position of FIG. 1.

Thus, with inner finger 42 in the extended position of FIG. 1, the linkage 30 will ensure that the opposite outer finger 50 is in the illustrated retracted position. As will be appreciated, the other inner finger 40 is linked to the opposite outer finger 52 in the same manner. Thus, upon overcoming the bias of springs 28, the inner fingers 40, 42 are pushed upwardly such that outer fingers 50, 52 are extended to the position of FIG. 2.

In operation, this automatic interchanging of positions between outer fingers 50, 52 and inner fingers 40, 42 provides automatic selection of a spacing between a gripping fingers according to a particular dimension of a component to be picked up, e.g., a DIP component.

Assuming that the tooling assembly is empty as illustrated in FIG. 3, the robot hand or other means of supporting the tooling assembly is manipulated to raise the empty tooling assembly and position it above a component supply, such as a component support rail 70 with component 2 thereon as illustrated in FIG. 1. The tooling assembly halves 20 and 22 have been properly separated from each other along a mid-plane sufficiently for pick-up of a component such as in FIG. 1.

Thereafter, the tooling assembly is lowered to the vertical position of FIG. 1 and closed upon the leads of the component and the robot hand is raised to transport and position the component relative to the holes of a circuit board into which the leads 4 of the component 2 are to be inserted. Then, the robot hand is lowered and a pusher bar 60 of the robot hand, which extends between halves 20 and 22, is actuated to push the component and effect insertion of the leads into the holes of the circuit board while the leads are guided or "funneled" by grooves on the inside of the fingers 40 and 42. At this time, the leads that protrude through the underside of the circuit board are normally clinched thereto.

Thereafter, the halves 20 and 22 are spread apart sufficiently to open the fingers 40 and 42 clear of the leads of the component and the robot hand is then retracted and moved to another supply station. If the next component to be picked up has a body of sufficient width, as illustrated in FIG. 2, the inner fingers 40 and 42 will engage the top surface thereof during lowering of the hand for the pick-up function. Thus, inner fingers 40 and 42 will retract against the compression of springs 28 and, through pivoting of links 30 and 34, outer fingers 50 and 52 will be extended to the position of FIG. 2.

Thereafter, the halves 20 and 22 are closed sufficiently to engage fingers 50 and 52 with the leads of the component and the previously described transport and insertion steps will be performed. However, it should be noted that as the pusher bar 60 is extended, the inner fingers 40 and 42 will remain in touch with the component which is being inserted and, in concert therewith, outer fingers 50 and 52 will be retracted.

Although the instant invention has been described with relation to DIP components, it is contemplated herein that other types of components, such as axial lead components whose leads have already been formed, could be handled in much the same way as disclosed herein, with modifications to the shapes of the fingers. It is further contemplated that more than two pairs of fingers could be utilized such that a broader range of component body widths may be handled without the time consuming step of shutting down the machine and interchanging the fingers to handle a component.

As may be appreciated, the instant invention allows several different sizes of components to be mounted by the same insertion head, thus eliminating the need for a separate run of circuit boards past an insertion station for each different size of DIP or the like to be inserted.

Among the objects made apparent from the preceding description, certain changes may be made in carrying out the above method and in the construction set forth without departing from the scope of the invention, and it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention, which, as a matter of language, might be said to fall therebetween.

We claim:

1. A method of handling components having bodies which may differ in at least one particular dimension, from component to component, and comprising the steps of:
    providing a gripper assembly having at least two pairs of fingers with a spacing between fingers of each pair of fingers providing a gripping range different from at least one other pair of fingers in order to grip components having said particular dimension corresponding to said gripping range of said each pair of fingers;
    selecting automatically between said pairs according to said particular dimension of each component; and
    gripping each said component upon actuation of said assembly.

2. A method as in claim 1, and further comprising the steps of:
    positioning one of said pairs of fingers at an extended, component handling location relative to a support bracket, with remaining pairs of said fingers retracted away from said component handling location; and
    retracting said one pair of fingers and extending another pair of said fingers, automatically and according to said particular dimension, in order to accomplish said gripping.

3. A method as in claim 1, and further comprising the step of:
    engaging each component with at least one of said pairs of fingers in order to perform said selecting.

4. A method as in claim 3, and further comprising the steps of:
    positioning an inside pair of said fingers having a narrower spacing between fingers thereof within an outside pair of said fingers having a wider said spacing;
    advancing said pairs toward a component for gripping thereof;
    gripping said component with said inside pair when said particular dimension of said component corresponds to said gripping range of said inside pair; and
    retracting said inside pair sufficiently and relative to said outside pair in order to allow gripping of said component by said outside pair and performing said gripping with said outside pair of fingers when said particular dimension is greater than said inside pair gripping range.

5. A method of handling components having bodies which may differ in at least one particular dimension, from component to component, and comprising the steps of:
    providing a gripper assembly having at least two pairs of fingers with each pair of fingers having a gripping range different from at least one other pair of fingers and being adapted to grip components having said particular dimension corresponding to said gripping range of said each pair of fingers;
    selecting automatically between said pairs according to said particular dimension of each component;
    positioning one of said pairs of fingers at an extended, component handling location relative to a support bracket, with remaining pairs of said fingers retracted a way from said component handling location;
    retracting said one pair of fingers and extending another pair of said fingers, automatically and according to said particular dimension, in order to accomplish gripping of each component; and
    gripping each said component upon actuation of said assembly.

6. A method of handling components having bodies which may differ in at least one particular dimension, from component to component, and comprising the steps of:
    providing a gripper assembly having at least two pairs of fingers with a spacing between fingers of each pair of fingers providing a gripping range different from at least one other pair of fingers in order to grip components having said particular dimension corresponding to said gripping range of said each pair of fingers;

engaging each component with at least one of said pairs of fingers in order to select automatically between said pairs according to said particular dimension of each component; and gripping each said component upon actuation of said assembly.

7. A gripper assembly for gripping components having bodies which may differ in at least one particular dimension from component to component, and comprising:

plural pairs of component gripping fingers, with a spacing between said fingers differing from pair to pair in order to handle components within a certain size range of said particular dimension; and means, operatively associated with said plural pairs of fingers, for selecting automatically between pairs of component gripping fingers according to said particular dimension of each component and gripping said component upon actuation of said assembly.

8. An apparatus as in claim 7, and further comprising:

means, operatively associated with said gripper assembly, for positioning one of said pairs of fingers at an extended, component handling location relative to a support bracket and remaining pairs of said fingers retracted away from said component handling location; and means, operatively associated with said gripper assembly, for retracting said one pair of fingers and extending another pair of said fingers, automatically and according to said particular dimension, in order to accomplish said gripping.

9. An apparatus as in claim 7, and further comprising:

means, operatively associated with said gripper assembly, for engaging each component with at least one of said pairs of fingers in order to perform said selecting.

10. An apparatus as in claim 9, and further comprising:

means, operatively associated with said gripper assembly, for positioning an inside pair of said fingers having a narrower spacing between fingers thereof within an outside pair of said fingers having a wider said spacing;

means, operatively associated with said gripper assembly, for advancing said pairs toward a component for gripping thereof;

means, operatively associated with said gripper assembly, for gripping said component with said inside pair when said particular dimension of said component corresponds to said gripping range of said inside pair; and means, operatively associated with said gripper assembly, for retracting said inside pair sufficiently and relative to said outside pair in order to allow gripping of said component by said outside pair and for gripping said component with said outside pair of fingers when said particular dimension is greater than said inside pair gripping range.

11. An apparatus for handling components having bodies which may differ in at least one particular dimension, from component to component, and comprising:

a gripper assembly having at least two pairs of fingers with fingers of each pair of fingers having a gripping range different from at least one other pair of fingers and being adapted to grip components having said particular dimension corresponding to said gripping range of said each pair of fingers; and means, operatively associated with said gripper assembly, for selecting automatically between said pairs according to said particular dimension of each component;

means, operatively associated with said gripper assembly, for gripping each said component upon actuation of said assembly;

means, operatively associated with said gripper assembly, for positioning one of said pairs of fingers at an extended, component handling location relative to a support bracket and remaining pairs of said fingers retracted away from said component handling location; and means, operatively associated with said gripper assembly, for retracting said one pair of fingers and extending another pair of said fingers, automatically and according to said particular dimension, in order to accomplish said gripping.

12. An apparatus for handling components having bodies which may differ in at least one particular dimension, from component to component, and comprising:

a gripper assembly having at least two pairs of fingers with each pair of fingers having a gripping range different from at least one other pair of fingers and being adapted to grip components having said particular dimension corresponding to said gripping range of said each pair of fingers; and means operatively associated with said gripper assembly, for engaging each component with at least one of said pairs of fingers in order to select automatically between said pairs according to said particular dimension of each component; and means, operatively associated with said gripper assembly, for gripping each said component upon actuation of said assembly.

* * * * *